US009594097B2

(12) United States Patent
Bogner et al.

(10) Patent No.: US 9,594,097 B2
(45) Date of Patent: Mar. 14, 2017

(54) DC DECOUPLED CURRENT MEASUREMENT

(71) Applicant: Infineon Technologies AG, Neubiberg (DE)

(72) Inventors: Peter Bogner, Wernberg (AT); Luca Petruzzi, Goedersdorf (AT)

(73) Assignee: Infineon Technologies AG, Neubiberg (DE)

( * ) Notice: Subject to any disclaimer, the term of this patent is extended or adjusted under 35 U.S.C. 154(b) by 281 days.

(21) Appl. No.: 14/305,562

(22) Filed: Jun. 16, 2014

(65) Prior Publication Data

US 2014/0292307 A1    Oct. 2, 2014

Related U.S. Application Data

(63) Continuation of application No. 13/160,337, filed on Jun. 14, 2011, now Pat. No. 8,754,635.

(51) Int. Cl.
*G01R 1/20* (2006.01)
*G01R 19/00* (2006.01)
*H02M 1/00* (2006.01)
*G01R 1/00* (2006.01)

(52) U.S. Cl.
CPC ............ *G01R 19/0092* (2013.01); *G01R 1/20* (2013.01); *G01R 1/00* (2013.01); *H01L 2221/00* (2013.01); *H02M 1/00* (2013.01)

(58) Field of Classification Search
CPC ....... G01R 1/00; H01L 21/00; H01L 2221/00; H02M 1/00
See application file for complete search history.

(56) References Cited

U.S. PATENT DOCUMENTS

| 4,368,420 A | 1/1983 | Kuo |
| 5,023,693 A | 6/1991 | Mori et al. |
| 5,304,918 A | 4/1994 | Khieu |
| 6,104,176 A | 8/2000 | McPartland et al. |
| 6,151,260 A * | 11/2000 | Birk .................... G11C 11/565 365/185.24 |
| 6,218,894 B1 | 4/2001 | De Langen et al. |

(Continued)

*Primary Examiner* — Jermele M Hollington
*Assistant Examiner* — Temilade Rhodes-Vivour
(74) *Attorney, Agent, or Firm* — Slater Matsil, LLP

(57) ABSTRACT

A circuit arrangement for measuring a load current provided to a load via a first load terminal of a load transistor is disclosed. In accordance with one example of the invention, the circuit arrangement includes a sense transistor coupled to the load transistor to provide a sense current representing the load current at a first load terminal of the sense transistor. The first load terminals of the load and the sense transistors are at respective floating electric potentials. A floating sense circuit coupled between the load terminals of sense transistor and load transistor, at least in one mode of operation the sense circuit receives the sense current and provides a floating signal representing the sense current. A non-floating measurement circuit is coupled to the sense circuit via a DC decoupling capacitor for transferring the floating signal representing the sense current to the non-floating measurement circuit. The measurement circuit is configured to provide an output signal representing the floating signal and thus the sense current.

23 Claims, 5 Drawing Sheets

(56) References Cited

U.S. PATENT DOCUMENTS

| | | | | |
|---|---|---|---|---|
| 6,323,517 B1 * | 11/2001 | Park | ................ | H01L 29/42324 |
| | | | | 257/314 |
| 6,737,856 B2 * | 5/2004 | Sander | ............... | G01R 19/0092 |
| | | | | 323/315 |
| 8,358,552 B2 * | 1/2013 | Mazure | ................ | G11C 7/067 |
| | | | | 365/189.011 |
| 2004/0207384 A1 * | 10/2004 | Brederlow | ....... | G01N 33/48728 |
| | | | | 324/71.5 |
| 2006/0158365 A1 | 7/2006 | Kernahan et al. | | |
| 2008/0291743 A1 * | 11/2008 | Edahiro | ................ | G11C 16/26 |
| | | | | 365/185.25 |
| 2010/0102845 A1 * | 4/2010 | Kadow | ............. | H03K 17/0822 |
| | | | | 324/762.09 |
| 2010/0194462 A1 * | 8/2010 | Petruzzi | ............ | H03K 17/0822 |
| | | | | 327/427 |

* cited by examiner

DC DECOUPLED CURRENT MEASUREMENT

This application is a continuation of U.S. patent application Ser. No. 13/160,337, filed on Jun. 14, 2011, which application is hereby incorporated herein by reference in its entirety.

TECHNICAL FIELD

The present disclosure generally relates to current measurement, for example, to digital output current measurement at high DC potentials.

BACKGROUND

For measuring the load current of a power transistor (particularly of an IGBT or a MOSFET) so-called sense-transistor arrangements are commonly used. An early publication of such a sense-transistor arrangement is, for example, the U.S. Pat. No. 5,023,693. In particular when using the power transistor as a high side semiconductor switch the load current may have to be measured at high DC potentials. Measuring current at a high DC potential usually requires the use of high voltage circuit components in the measurement circuit. Such high voltage components entail a more complex circuit design and require a large amount of chip area. Especially, when the measurement result is provided as a digital value the requirement for a high proof-voltage includes considerable problems in the circuit design. Thus, there is a need for a current measurement circuit which allows for current measurement at high DC potentials with only a few high voltage circuit components.

SUMMARY OF THE INVENTION

A circuit arrangement for measuring a load current provided to a load via a first load terminal of a load transistor is disclosed. In accordance with one example of the invention, the circuit arrangement includes a sense transistor coupled to the load transistor to provide a sense current representing the load current at a first load terminal of the sense transistor. The first load terminals of the load and the sense transistors are at respective floating electric potentials. A floating sense circuit coupled between the load terminals of sense transistor and load transistor, at least in one mode of operation the sense circuit receives the sense current and provides a floating signal representing the sense current. A non-floating measurement circuit is coupled to the sense circuit via a DC decoupling capacitor for transferring the floating signal representing the sense current to the non-floating measurement circuit. The measurement circuit is configured to provide an output signal representing the floating signal and thus the sense current.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION OF ILLUSTRATIVE EMBODIMENTS

Figure 1:
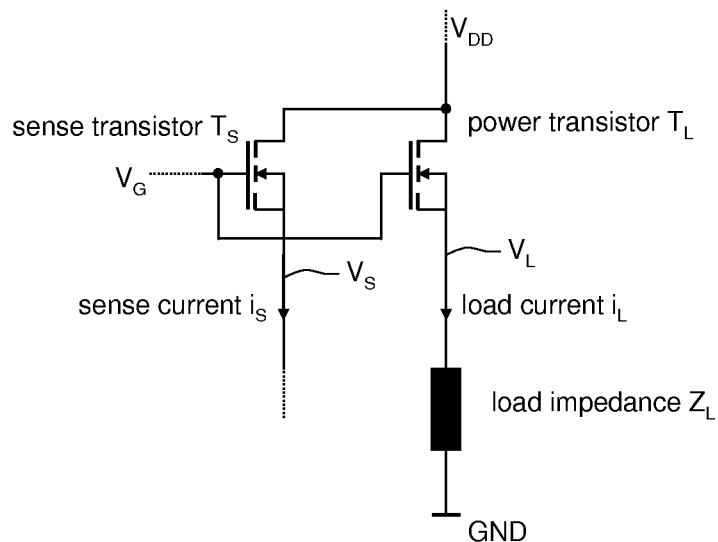
FIG. 1 illustrates a general example of a sense-transistor arrangement.

FIG. 1 generally illustrates the operating principle of a sense transistor arrangement wherein the present example includes MOSFETs as power and sense transistors. The power transistor $T_L$ may be composed of a plurality of transistor cells so as to be able to switch a high load current $i_L$ supplied to a load having a load impedance $Z_L$. In contrast thereto, only one or a few transistor cells are used to form the sense transistor $T_S$, whereby the transistor cells of both transistors are essentially identical and may have one common drain (or collector) terminal and one common gate terminal. The separated source (or emitter) terminals provide the load current $i_L$ and the sense current $i_S$, respectively. Provided that both transistors are operated in the same operating point, the sense current $i_S$ is proportional to the load current $i_L$. The proportionality factor $k=i_L/i_S$ is thereby determined by the ratio of the active area of the transistors $T_L$ and $T_S$ which is equivalent to the ratio of the number of transistor cells active in the transistors $T_L$ and $T_S$. The present example illustrates a common-drain/separated-source transistor structure. Alternatively, common-source/separated-drain transistor structures are applicable. It should be noted that the factor k may usually range from 1000 (or below) up to 10000 or even above dependent on the application.

The sense current $i_S$ may be measured in any useful way, the sense current $i_S$ may, for example, be drained via a measurement resistor $R_S$ and the voltage drop $i_S \cdot R_S = i_L \cdot R_S/k$ across the measurement resistor $R_S$ may be used as measurement value representing the load current $i_L$. As mentioned above, the proportionality between load current $i_L$ and sense current $i_S$ is maintained as long as both transistors are operated (at lease approximately) at the same operating point, i.e., at the same drain-source voltage (or collector-emitter voltage) while being supplied with the same gate (or base) voltage. In the example of FIG. 1, the source potentials $V_S$ and $V_L$ of the two transistors $T_S$ and $T_L$ should be essentially equal so as to comply with the condition discussed above and ensure proportionality between load and sense current.

As can be seen from FIG. 1, the source potential $V_S$, $V_L$ of each transistor $T_S$, $T_L$ may assume considerable high values when the load transistor $T_L$ is driven into an on-state and thus the supply voltage $V_{DD}$ is essentially applied to the load impedance $Z_L$. For this reason, any measurement circuitry for directly or indirectly measuring the sense current $i_S$ usually includes high-voltage proof circuit components which has an adverse impact on the circuit design as already mentioned further above. A further problem arises when the load impedance $Z_L$ connected to the load transistor $T_L$ includes an inductive component. In this case the source potential $V_L$ of the load transistor $T_L$ may assume negative values and the proportionality between load and sense current can not be maintained when using conventional sense-transistor arrangements.

Figure 2:
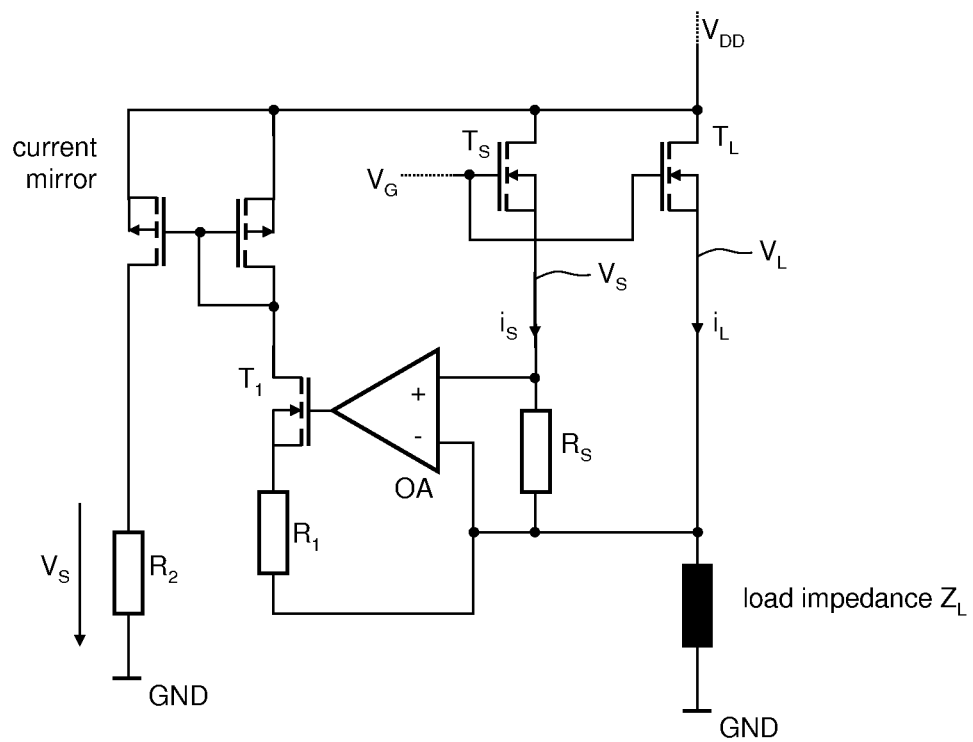
FIG. 2 illustrates an example of a sense-transistor arrangement which is able to handle negative source potentials with respect to ground potential.

FIG. 2 illustrates one example of a sense transistor arrangement which allows for a current measurement even during periods of negative source potentials $V_L$. It is apparent from the circuit of FIG. 2 that such an approach is inefficient in terms of chip space and power consumption. The required matching of the source voltages $V_L$ and $V_S$ is ensured by a relatively small shunt resistor $R_S$ coupled between the source terminals of load transistor $T_L$ and sense transistor $T_S$. The voltage difference $V_S = i_S R_S$ has only a negligible impact on the operating point of the sense transistor and thus the proportionality between load and sense current is not affected. The operational amplifier OA drives the gate of transistor $T_1$ such that the voltage drop across resistor $R_1$ matches the voltage drop across the shunt resistor $R_S$. The current through the transistor $T_1$ is "copied" by the current minor composed of transistors $T_2$ and $T_3$ and the minor current $i_2$ is drained via a resistor $R_2$ resulting in a voltage drop across $V_S$ resistor $R_2$ which is (approximately) proportional to the load current $i_L$ even when the source potential $V_L$ of the load transistor $T_L$ is negative. In case the resistors $R_S$, $R_1$, and $R_2$ have equal resistance values the sense voltage $V_S$ yields $V_S = i_S \cdot R_S = i_L \cdot R_S / k$.

As mentioned above, an implementation simpler and more efficient than the example of FIG. 2 may be desirable. Further, the transistors $T_1$, $T_2$, and $T_3$ have to be high-voltage proof and thus require a large chip area. To improve this situation is a design goal for alternative approaches.

Figure 3:
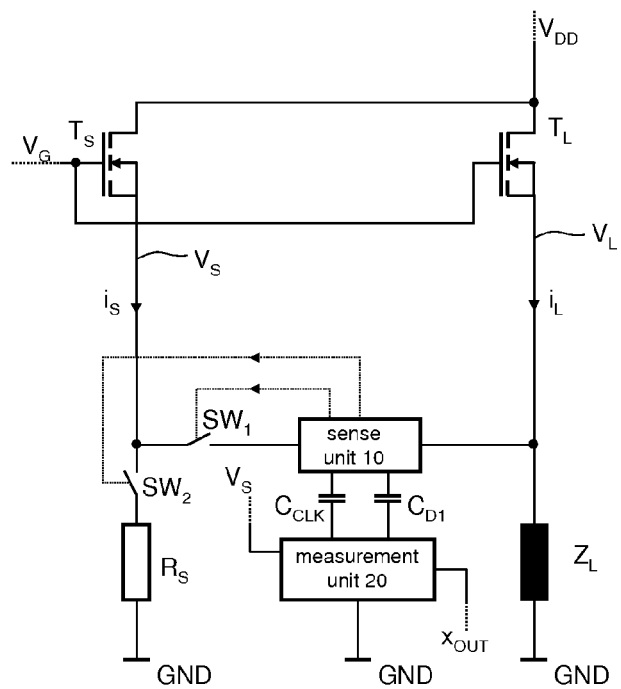
FIG. 3 illustrates, as one exemplary embodiment of the invention, a sense-transistor arrangement including a floating sense circuit and a measurement circuit being DC decoupled therefrom.

FIG. 3 illustrates one example of a sense-transistor arrangement for measuring the sense current provided by a sense transistor $T_S$ (which is coupled to a load transistor $T_L$ as in the previous examples) even when the source potential $V_L$ of the load transistor $T_L$ falls below ground potential (e.g., due to an inductive load $Z_L$). The exemplary circuit arrangement of FIG. 3 includes two electronically controllable switches $SW_1$ and $SW_2$ which alternately switch on and off so as to provide two different modes of operation (mode 1: $SW_1$=off and $SW_2$=on, mode 2: $SW_1$=on and $SW_2$=off).

In cases when the source potential $V_L$ of the load transistor $T_L$ is above a threshold (e.g., when $V_L > 0V$) switch $SW_1$ is switched off and switch $SW_2$ is switched on (mode 1) resulting in a circuit equivalent to the conventional circuit as illustrated in FIG. 1. The sense current $i_S$ may be drained to ground via a measurement resistor $R_S$ coupled between the source of the sense transistor $T_S$ and ground GND. The voltage drop $i_S R_S = i_L R_S / k$ across the measurement resistor $R_S$ may be taken as a measurement value (approximately) proportional to the load current. The proportionality between sense current $i_S$ and load current $i_L$ is not perfect as the source potentials $V_L$ and $V_S$ may slightly differ from each other. However, this effect is small and thus negligible provided that the source potentials are positive and the voltage drop $V_{DS}$ across the load paths of the transistors $T_S$ and $T_L$ is small compared to the supply voltage $V_{DD}$. ($V_{DS} = i_L R_{ON}$, $R_{ON}$ being the on-resistance of the load transistor).

In cases when the source potential $V_L$ of the load transistor $T_L$ is below a threshold (e.g., when $V_L < 0V$) switch $SW_1$ is switched on and switch $SW_2$ is switched off (mode 2). As a result the sense current $i_S$ is drained to ground via a floating sense circuit 10 and the load impedance $Z_L$ as illustrated in FIG. 3. That is, the floating sense circuit 10 coupled the source terminals of sense transistor $T_S$ and load transistor $T_L$, respectively. The sense circuit 10 is configured to keep the potential difference $V_S - V_L$ to ensure that both transistors operate (at least approximately) in the same operating point (i.e., the drain-source-voltages and the gate voltages of the transistors are approximately the same). The floating sense circuit 10 is further configured to sense a floating voltage signal representing the sense current $i_S$ and to transfer the signal level to a ground-referenced measurement circuit 20 using a switched capacitor $C_{D1}$. As a capacitor $C_{D1}$ is used for transferring the sense current information to the ground-referenced measurement circuit 20 the two circuits (sense circuit 10 and measurement circuit 20) are DC decoupled allowing for almost arbitrarily high source potentials $V_S$, $V_L$. The only limiting parameter is the withstand voltage of the decoupling capacitor $C_{D1}$. FIG. 3 also includes a further capacitor $C_{CLK}$, AC coupling the floating sense circuit 10 and the measurement circuit 20. This capacitor $C_{CLK}$ is provided to transfer a clock signal (CLK) from the "low side" (i.e., the measurement circuit 20) to the "high side" (i.e., the floating sense circuit 10), whereby the clock signal is required to control the switching operation of the switches.

The control of the switches (which may be regarded as a part of the sense circuit 10) is not illustrated herein in detail. However, any low voltage semiconductor switches (e.g., DMOS switches) may be used for this purpose. The semiconductor switches may be driven to an on-state or an off-state by any appropriate circuitry known in the art. The measurement circuit 20 may be supplied by a separate supply voltage $V_S$ lower than the supply voltage $V_{DD}$ and may be configured to transform the sense current information obtained from the floating sense circuit 10 to an (analog or digital) output signal $x_{OUT}$ which represents the load current $i_L$ and may be adequately scaled for further processing. In essence the output signal is (at least approximately) proportional to the load current $i_L$ as mentioned above.

Figure 4:
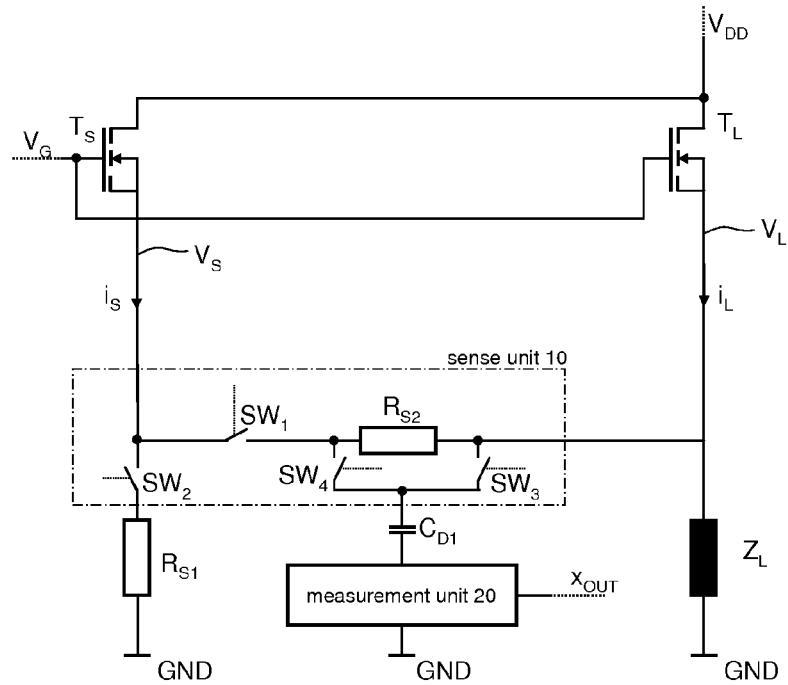
FIG. 4 illustrates the example of FIG. 3 in more detail.

FIG. 4 illustrates the example discussed above with reference to FIG. 3 in more detail. Particularly, one example of the implementation of the sense circuit 10 is given. It should be noted that the capacitor $C_{CLK}$ and the details of the circuitry driving the switches have been omitted for the ease of illustration. As already noted, circuitry for driving the semiconductor switches $SW_1$, $SW_2$, etc., is readily available.

During the above-mentioned operating mode 1 the present example of FIG. 4 operates identically as the general example of FIG. 3. That is, the sense current $i_S$ is drained via the measurement resistor $R_{S1}$ connected between the source of the sense transistor $T_S$ and ground GND, and the voltage drop across the resistor $R_{S1}$ can be taken as a measurement value representing the load current $i_L$.

Further, in the present example, the floating sense circuit 10 includes a shunt resistor $R_{S2}$ for providing, during the above mentioned operating mode 2, a current path from the source of the sense transistor $T_S$ to the source of the load transistor $T_L$ (which is connected to the load) in a similar way as it is the case in the example of FIG. 2. The switches $SW_1$ and $SW_2$ have the same function (i.e., mode switch) as in the general example of FIG. 3. Two further switches $SW_3$ and $SW_4$ are provided to connect the "high side" terminal of the capacitor $C_{D1}$ either with the terminal of the shunt resistor $R_{S2}$ coupled to the sense transistor source or with the terminal of the shunt resistor $R_{S2}$ coupled to the load transistor source. That is, the "high side" terminal of the capacitor $C_{D1}$ coupling to the sense circuit 10 is either switched to sense transistor source potential $V_S$ or to load transistor source potential $V_L$, wherein the potential difference $V_S-V_L$ equals the voltage drop $R_{S2}i_S$ across the shunt resistor $R_{S2}$ and thus $$V_S-V_L=R_{S2}i_S. \quad (1)$$

The "low side" terminal of the DC decoupling capacitor $C_{D1}$ is coupled to the, e.g., ground-reference, measurement circuit 20. Provided that the capacitor $C_{D1}$ is pre-charged to a defined voltage, such as, for example, to a voltage $V_L$ while switch $SW_3$ is closed and switch $SW_4$ is open, and provided that the leakage current discharging the capacitor $C_{D1}$ is negligible, the voltage drop $R_{S2}i_S$ across the shunt resistor $R_{S2}$ can be observed as voltage swing of the same amount $R_{S2}i_S$ at the "low side" terminal of the capacitor $C_{D1}$ when switching switch $SW_3$ off and switch $SW_4$ on. In this way the sense current information can be transferred from the floating sense circuit 10 to the ground-referenced (i.e., non-floating) measurement circuit 20 without the need for a high-voltage proof circuit component except for the decoupling capacitor $C_{D1}$. As should become clear from the discussion above, the switches $SW_3$ and $SW_4$ are alternately switched on and off and are never on simultaneously. That is, the two switches $SW_3$ and $SW_4$ provide the function of a single changeover switch. The same applies for the switches $SW_1$ and $SW_2$ analogously which direct the sense current either to the measurement resistor $R_{S1}$ or to the shunt resistor $R_{S2}$.

Figure 5A:
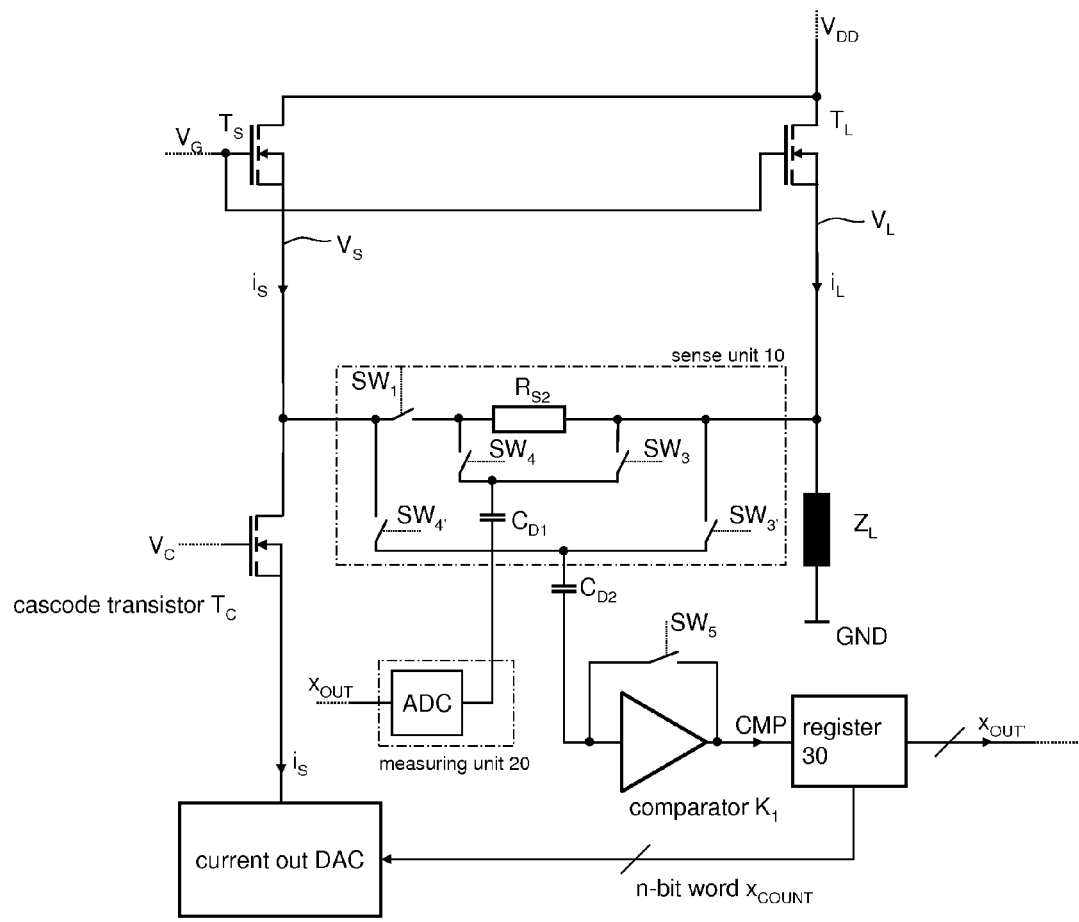
FIG. 5a illustrates an alternative to the example of FIG. 4.
Figure 5B:
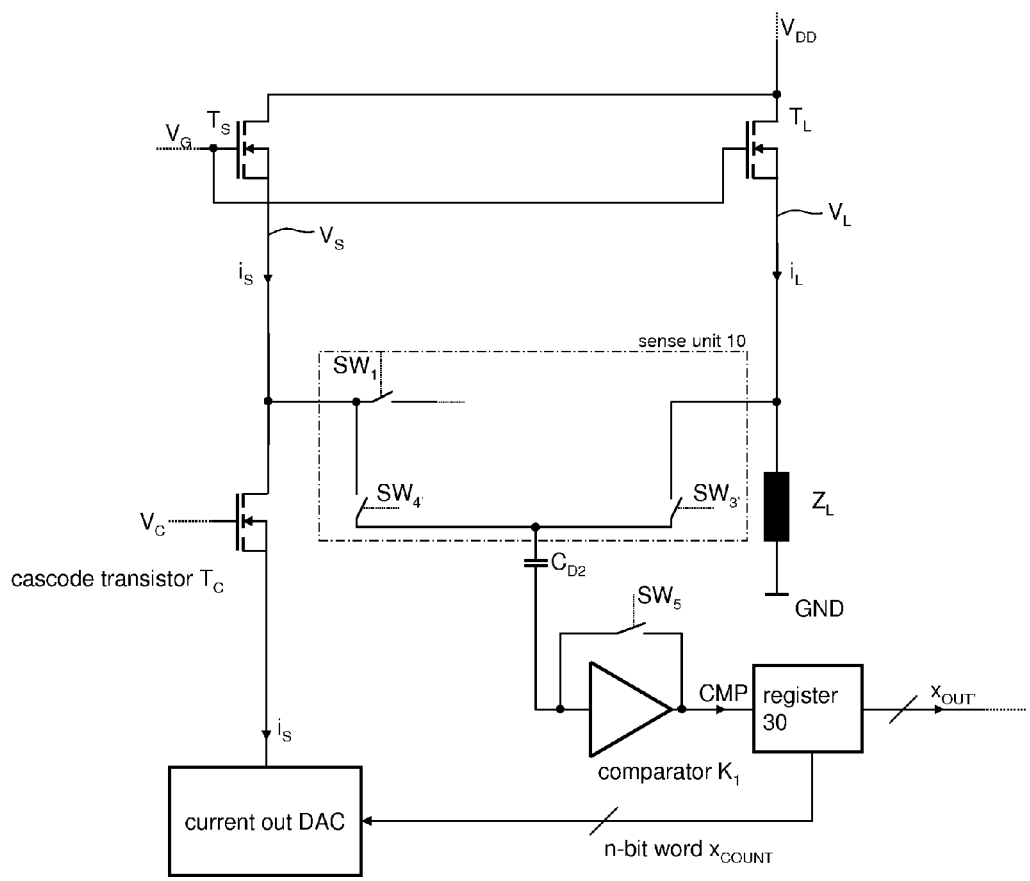
FIG. 5b illustrates the example of FIG. 5a in a first mode of operation.
Figure 5C:
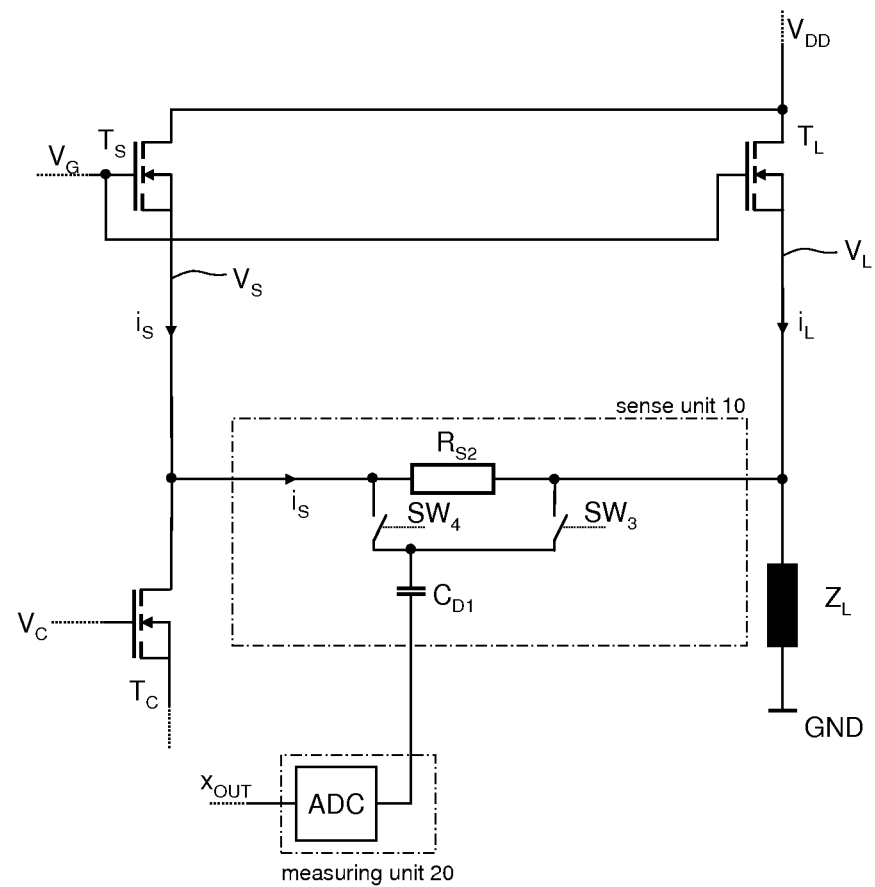
FIG. 5c illustrates the example of FIG. 5a in a second mode of operation.

FIG. 5a illustrates a more sophisticated alternative to the example of FIG. 4. During operating mode 2 (i.e., sense current measurement using the shunt resistor $R_{S2}$) the example of FIG. 5a illustrates exactly like the example of FIG. 4. In this case the cascode transistor $T_C$ blocks the sense current $i_S$ and thus has the same effect as an open switch $SW_2$ in the example of FIG. 4. Consequently switch $SW_1$ is closed during this mode. The "remaining" active part of the circuit during this mode is illustrated in FIG. 5c. The complementary situation (mode 1, cascode transistor $T_C$ on, switch $SW_1$ off) is illustrated in FIG. 5b where all the circuit components inactive during this mode have been omitted to allow concentrating on the relevant parts of the circuit. Below the function of the circuit of FIG. 5a will be explained with reference to FIGS. 5b and 5c which cover the effective circuit of FIG. 5a in mode 1 and 2, respectively.

In cases when the source potential $V_L$ of the load transistor $T_L$ is above a threshold (e.g., when $V_L>0V$) switch $SW_1$ is switched off and the cascode transistor $T_C$ is in an on state (mode 1) resulting in an effective circuit as illustrated in FIG. 5b. Accordingly, the "high side" terminal of a decoupling capacitor $C_{D2}$ is either connected to the source potential $V_S$ of the sense transistor $T_S$ or to the source potential $V_L$ of the load transistor $T_L$ by closing switch $SW_{4'}$ or, respectively, switch $SW_{3'}$ while the other switch is open.

The "low side" terminal of the decoupling capacitor $C_{D2}$ is coupled to an input of a comparator $K_1$ whose output is coupled to a register 30 which may be, for example a successive approximation register. A current output digital-to-analog converter DAC is coupled to the cascode transistor to sink the sense current $i_S$ and is configured to set the sense current to an analog current value corresponding to the digital input value $x_{COUNT}$ which generally is a n-bit binary word provided by the register 30. The aim is to set the sense current $i_S$ to such a value that the source potentials $V_S$ and $V_L$, respectively, are equal. In this ideal matching state, the sense current $i_S$ and the load current $i_L$ are perfectly proportional. Generally, the n-bit binary word $x_{COUNT}$ supplied to the current output digital-to-analog converter DAC, and thus the sense current $i_S$, is varied (e.g., ramped up starting from an initial value) until the mentioned matching condition is achieved. This matching condition may be detected using the sense circuit 10, the decoupling capacitor $C_{D2}$ and the comparator $K_1$. The detection process is outlined below.

A measurement cycle starts with varying the n-bit word $x_{COUNT}$ and thereby setting the sense current $i_S$ to a corresponding analog current value. The variation may be, for example, increasing the current register value $x_{COUNT}$. Then the charge stored on the capacitor $C_{D2}$ is initialized. Therefore, switch $SW_3$ is closed thus coupling the capacitor $C_{D2}$ between the load transistor source and the comparator input. At the same time a defined potential is applied at the comparator input thus allowing the capacitor $C_{D2}$ to charge to a voltage determined by the source voltage $V_L$ and the mentioned defined potential. For example, a switch $SW_5$ may be used to short circuit the comparator thereby forcing the comparator input to a potential defined by the quiescent point of the comparator's internal input stage. Subsequently switch $SW_5$ is opened and, further, switch $SW_{4'}$ is closed while switch $SW_{3'}$ is opened, too. This switching results in a voltage swing at the comparator input equal to the potential difference $V_S-V_L$. In a perfect matching state this difference is zero and the current register value is taken as measurement result $X_{OUT}$. In case of an insufficient matching the comparator $K_1$ detects the mentioned voltage swing and the comparator output CMP triggers the register 30 to, again, vary the current register value $x_{COUNT}$ and the cycle starts over. The cyclic repetition of the measurement cycles only stops when a matching state—and thus a sensible measurement value—is found, or if a maximum number of cycles passed without a result.

FIG. 5c illustrates the complementary case to the example of FIG. 5b. In this mode of operation (mode 2) the cascode transistor $T_C$ pinches off the current flow as the source potential $V_S$ of the cascode transistor $T_C$ (which is the same as the source potential of the sense transistor $T_S$) is too low or even negative. Switch $SW_1$ is closed (therefore not shown in FIG. 5c) and the effective circuit is the same as already explained with reference to FIGS. 3 and 4. The ground-referenced measurement circuit is an analog-to-digital converter having a voltage input and a digital output. The analog-to-digital-converter may include a sample-and-hold circuit which "holds" the voltage swing of the decoupling capacitor $C_{D1}$ during the analog-to-digital-conversion.

The criterion for switching from mode 1 (effective circuit of FIG. 5b) and mode 2 (effective circuit of FIG. 5c) has already been mentioned above. The mode switch may be initiated when the source potential $V_L$ of the load transistor falls below (or vice versa rises above) a given threshold. It should be noted that a skilled person will have no difficulties in implementing this particular function so this is not described in more detail herein. Alternatively, a mode switch can be initiated when in mode 1 a sensible measurement value can not be found. Further, a mode switch may be initiated dependent on the source potential of the cascode transistor $T_C$.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those where not explicitly been mentioned. Further, the methods of the

What is claimed is:

1. A circuit arrangement for measuring a load current provided to a load via a first load terminal of a load transistor, the circuit arrangement comprising:
   a sense transistor operatively coupled to the load transistor to provide a sense current representing the load current at a first load terminal of the sense transistor, wherein the first load terminals of the load and the sense transistors are at respective floating electric potentials;
   a floating sense circuit operatively coupled between the load terminals of the sense transistor and the load transistor, wherein at least in one mode of operation the sense circuit receives the sense current and provides a floating signal representing the sense current;
   a DC decoupling capacitor; and
   a non-floating measurement circuit operatively coupled to the sense circuit via the DC decoupling capacitor for transferring the floating signal representing the sense current to the non-floating measurement circuit,
   wherein the measurement circuit is configured to provide an output signal representing the floating signal and thus the sense current.

2. The circuit arrangement of claim 1, wherein the floating sense circuit and the non-floating measurement circuit are configured to transfer the floating signal by switching the DC decoupling capacitor.

3. The circuit arrangement of claim 1, wherein the floating sense circuit includes a shunt resistor conducting the sense current and switching circuitry configured to connect one terminal of the DC decoupling capacitor either to a first or to a second terminal of the shunt resistor using semiconductor switches.

4. The circuit arrangement of claim 3, wherein the measurement circuit is configured to apply a defined voltage to the DC decoupling capacitor while coupled to the first terminal of the shunt resistor and to observe a voltage swing at a low side terminal of the DC decoupling capacitor when switching the DC decoupling capacitor from the first terminal of the shunt resistor to the second terminal of the shunt resistor.

5. The circuit arrangement of claim 4, wherein the measurement circuit includes an analog-to-digital converter configured to convert the voltage swing into a digital output word.

6. The circuit arrangement of claim 1, further comprising:
   a digital register providing a first digital word,
   a current output digital-to-analog converter coupled to the sense transistor and configured to set the sense current to a current value representing the first digital word, and
   a comparator that is sequentially capacitively coupled to the load terminals of the load transistor and the sense transistor and is configured to compare the potentials at the load terminals,
   wherein, in a second mode of operation, a digital register value is iteratively varied until either a matching of the potentials at the load terminals is detected or a maximum number of iterations has been reached.

7. The circuit arrangement of claim 6, further comprising a coupling capacitor which is connectable, via a controllable switch, between a comparator input and either the load terminal of the sense transistor or the load terminal of the load transistor.

8. The circuit arrangement of claim 6, wherein the digital register is a successive approximation register.

9. The circuit arrangement of claim 6, wherein the digital register is varied dependent on a comparator output which is indicative of whether the potentials of the load terminals match or of which potential is higher.

10. The circuit arrangement of claim 9, wherein the digital register value is increased to increase the digital-to-analog-converter output current when the potential at the load terminal of the sense transistor is higher than of the load transistor, and vice versa.

11. The circuit arrangement of claim 6, wherein the mode of operation is switched dependent on the potential of the load terminal of the load transistor or the sense transistor.

12. The circuit arrangement of claim 1, wherein the mode of operation is switched dependent on the potential of the load terminal of the load transistor or the sense transistor.

13. The circuit arrangement of claim 1, wherein the sense current and the load current are DC currents.

14. A method of measuring a current of a sense transistor coupled to a load transistor, the method comprising:
   coupling a first terminal of a coupling capacitor to a first terminal of a shunt resistor coupled between load terminals of the load transistor and the sense transistor during a first time period;
   coupling the first terminal of the coupling capacitor to a second terminal of the shunt resistor during a second time period;
   measuring a voltage difference between a voltage of a second terminal of the coupling capacitor during the first time period and a voltage of the second terminal of the coupling capacitor during the second time period; and
   generating a measurement signal based on the measured voltage difference.

15. The method of claim 14, wherein generating the measurement signal comprises:
   applying an output of a current output digital-to analog converter to the load terminal; and
   updating a successive approximation register based on the measured voltage difference.

16. The method of claim 14, further comprising coupling the load terminal of the sense transistor to a reference node via a first resistor when a voltage difference between the load terminal of the load transistor and the reference node is greater than a threshold voltage.

17. The method of claim 14, wherein a DC sense current passes through the shunt resistor coupled between load terminals of the load transistor and the sense transistor, respectively, thus causing different potentials at the first and the second terminals of the shunt resistor.

18. A circuit comprising:
   a sensing circuit configured to be coupled to an output terminal of a load transistor via a first input terminal, and a load terminal of a sense transistor via a second input terminal, wherein the sensing circuit comprises a switching network configured to selectively couple the first input terminal and a second input terminal to an output node of the sensing circuit; and
   a measurement circuit having an input capacitively coupled to an output of the sensing circuit, wherein the measurement circuit is configured to provide an output value indicative of current of the sense transistor.

19. The circuit of claim 18, further comprising:
a resistor coupled between the first input terminal and the second input terminal; and
a first switch coupled between the resistor and the output node of the sensing circuit, wherein the first switch is configured to be closed when a voltage of the first input terminal is below a threshold voltage.

20. The circuit of claim 19, wherein:
the switching network is configured to couple a first terminal of the resistor to the measurement circuit via a coupling capacitor during a first time period, and then couple a second terminal of the resistor to the measurement circuit via the coupling capacitor during a second time period; and
the measurement circuit is configured to measure a voltage difference at a terminal of the coupling capacitor between the first time period and the second time period, and generate the output value indicative of current of the sense transistor based on the measured voltage difference.

21. The circuit of claim 18, further comprising:
a current generator having an current output coupled to the second input terminal;
the switching network is configured to couple one of the first input terminal and the second input terminal to the measurement circuit via a coupling capacitor during a first time period, and then couple the other one of the first input terminal and the second input terminal to the measurement circuit via the coupling capacitor during a second time period; and
the measurement circuit is configured to measure a voltage difference at a terminal of the coupling capacitor between the first time period and the second time period, and update an output current of the current generator based on the measured voltage difference.

22. The circuit of claim 21, wherein the current generator comprises a digital to analog converter, and the measurement circuit is configured to update the output current by updating a value of a successive register having an output coupled to an input of the digital to analog converter.

23. The circuit of claim 18, wherein a DC sense current passes through the sensing circuit from the second input terminal to the first input terminal thus causing different potentials at the first input terminal and the second input terminal.

* * * * *